(12) United States Patent
Shur et al.

(10) Patent No.: US 9,390,809 B1
(45) Date of Patent: Jul. 12, 2016

(54) DATA STORAGE IN A MEMORY BLOCK FOLLOWING WL-WL SHORT

(71) Applicant: APPLE INC., Cupertino, CA (US)

(72) Inventors: Yael Shur, Herzlia Pituach (IL); Avraham Poza Meir, Herzlia Pituach (IL); Barak Baum, Herzlia Pituach (IL); Eyal Gurgi, Herzlia Pituach (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/617,961

(22) Filed: Feb. 10, 2015

(51) Int. Cl.
| | |
|---|---|
| *G11C 16/34* | (2006.01) |
| *G11C 16/14* | (2006.01) |
| *G11C 16/26* | (2006.01) |
| *G11C 29/00* | (2006.01) |

(52) U.S. Cl.
CPC ............ *G11C 16/3459* (2013.01); *G11C 16/14* (2013.01); *G11C 16/26* (2013.01); *G11C 29/70* (2013.01)

(58) Field of Classification Search
CPC .... G11C 16/14; G11C 16/26; G11C 16/3459; G11C 29/70; G11C 29/88
See application file for complete search history.

(56) References Cited

U.S. PATENT DOCUMENTS

| | | | |
|---|---|---|---|
| 4,841,482 A | 6/1989 | Kreifels | |
| 5,181,025 A | 1/1993 | Ferguson et al. | |
| 5,331,594 A | 7/1994 | Hotta | |
| 5,372,712 A | 12/1994 | Petit | |
| 5,428,621 A | 6/1995 | Mehrotra et al. | |
| 5,440,516 A | 8/1995 | Slemmer | |
| 5,581,509 A | 12/1996 | Golla et al. | |
| 5,602,778 A | 2/1997 | Futatsuya et al. | |
| 5,606,527 A | 2/1997 | Kwack et al. | |
| 5,684,747 A * | 11/1997 | Urai ................... | G11C 16/3404 365/185.22 |
| 5,748,545 A | 5/1998 | Lee et al. | |
| 5,796,653 A | 8/1998 | Gaultier | |
| 5,847,995 A | 12/1998 | Kobayashi et al. | |
| 5,898,637 A | 4/1999 | Lakhani et al. | |
| 6,031,772 A | 2/2000 | Nagatomo | |
| 6,545,910 B2 | 4/2003 | Byeon et al. | |
| 6,650,585 B2 | 11/2003 | Chevallier | |
| 6,707,078 B1 | 3/2004 | Shiraiwa et al. | |
| 6,813,183 B2 | 11/2004 | Chevallier | |
| 7,089,460 B2 | 8/2006 | Fu | |
| 7,212,454 B2 | 5/2007 | Kleveland | |
| 7,319,623 B1 | 1/2008 | Yuan et al. | |

(Continued)

OTHER PUBLICATIONS

Rotbard et al., U.S. Appl. No. 14/572,818 dated Dec. 17, 2014.

(Continued)

*Primary Examiner* — Harry W Byrne
*Assistant Examiner* — Lance Reidlinger
(74) *Attorney, Agent, or Firm* — D. Kligler IP Services Ltd.

(57) ABSTRACT

A method includes defining a normal voltage configuration for application to word lines (WLs) and Bit lines (BLs) of a memory block, and a an abnormal voltage configuration, different from the normal voltage configuration, for application to the WLs and the BLs of the memory block when a word-line-to-word-line (WL-WL) short-circuit is found between at least two of the WLs in the memory block. If no WL-WL short-circuit is found in the memory block, a data storage operation is performed in the memory block by applying the normal voltage configuration. If a WL-WL short-circuit is found in the memory block, the data storage operation is performed in the memory block by applying the abnormal voltage configuration.

16 Claims, 2 Drawing Sheets

(56) References Cited

U.S. PATENT DOCUMENTS

| | | |
|---|---|---|
| 7,440,347 B1 | 10/2008 | Vogelsang |
| 7,463,529 B2 | 12/2008 | Matsubara |
| 8,305,807 B2 | 11/2012 | Shah et al. |
| 8,379,454 B2 | 2/2013 | Kochar et al. |
| 8,432,732 B2 | 4/2013 | Li et al. |
| 8,514,630 B2 | 8/2013 | Huynh et al. |
| 8,730,722 B2 | 5/2014 | Koh et al. |
| 8,902,657 B2 | 12/2014 | Iwai et al. |
| 2009/0225607 A1 | 9/2009 | Chen et al. |
| 2010/0329052 A1 | 12/2010 | Chen et al. |
| 2014/0189438 A1 | 7/2014 | Arbel et al. |
| 2014/0254264 A1* | 9/2014 | Dutta ............ G11C 16/3459 365/185.03 |
| 2014/0269071 A1 | 9/2014 | Pandya et al. |
| 2014/0321202 A1 | 10/2014 | Yang et al. |

OTHER PUBLICATIONS

U.S. Appl. No. 14/572,818 Office Action dated Oct. 29, 2015.

\* cited by examiner

DATA STORAGE IN A MEMORY BLOCK FOLLOWING WL-WL SHORT

TECHNICAL FIELD

Embodiments described herein relate generally to memory devices, and particularly to methods and systems for data storage in memory devices following word-line-to-word-line short.

BACKGROUND

Non-Volatile Memory (NVM) devices are subject to failures, such as word-line-to-word-line WL-WL short-circuit events. Several techniques for mitigating WL-WL short have been proposed. For example, U.S. Pat. No. 5,898,637, whose disclosure is incorporated herein by reference, describes a memory system that includes an array of memory cells connected along word lines and bit lines. A disclosed technique allows shorted word lines to be selected simultaneously during a programming operation, preliminary to an erase operation, to prevent the word-line supply from shorting to ground during the programming operation.

U.S. Pat. No. 8,730,722, whose disclosure is incorporated herein by reference, describes a technique that preserves data that would otherwise be lost in case of WL-WL short. Before writing a word line, the data from a previously written adjacent word line is read back and stored in data latches associated with the corresponding bit lines, but that are not being used for the data to be written. If a short occurs, as the data for both word lines is still in the latches, it can be written to a new location.

SUMMARY

An embodiment that is described herein provides a method including defining a normal voltage configuration for application to word lines (WLs) and Bit lines (BLs) of a memory block, and a an abnormal voltage configuration, different from the normal voltage configuration, for application to the WLs and the BLs of the memory block when a word-line-to-word-line (WL-WL) short-circuit is found between at least two of the WLs in the memory block. If no WL-WL short-circuit is found in the memory block, a data storage operation is performed in the memory block by applying the normal voltage configuration. If a WL-WL short-circuit is found in the memory block, the data storage operation is performed in the memory block by applying the abnormal voltage configuration.

In some embodiments, applying the abnormal voltage configuration includes applying an identical pass voltage to a pair of the WLs between which the WL-WL short-circuit occurs. In an embodiment, performing the data storage operation includes reading data from a WL that neighbors the pair of the WLs, while the identical pass voltage is applied to the pair of the WLs. In another embodiment, applying the abnormal voltage configuration includes applying to a WL in which the WL-WL short-circuit occurs a first pass voltage, which is higher than a second pass voltage that is applied to the WL in the normal voltage configuration.

In yet another embodiment, the data storage operation includes programming of a selected WL in the memory block, and applying the abnormal voltage configuration includes applying to the selected WL a first programming-verification threshold, which is higher than a second programming-verification threshold applied to the selected WL in the normal voltage configuration. In an example embodiment, defining the abnormal voltage configuration includes estimating an erase penetration in the selected WL, and setting the first programming-verification threshold based on the estimated erase penetration.

In some embodiments, the method includes switching from the normal voltage configuration to the abnormal voltage configuration even though no programming failure was reported for the memory block. In a disclosed embodiment, the method includes switching from the normal voltage configuration to the abnormal voltage configuration in response to detecting the WL-WL short-circuit during operation of the memory block in a host system. Additionally or alternatively, the method may include switching from the normal voltage configuration to the abnormal voltage configuration in response to a detection of the WL-WL short-circuit during production testing of the memory block.

There is additionally provided, in accordance with an embodiment that is described herein, an apparatus including a memory and circuitry. The memory includes at least a memory block. The circuitry is configured to perform a data storage operation in the memory block, by applying to word lines (WLs) and Bit Lines (BLs) of the memory block a normal voltage configuration if no word-line-to-word-line (WL-WL) short-circuit is found between at least two of the WLs in the memory block, and by applying to the WLs and the BLs of the memory block an abnormal voltage configuration, different from the normal voltage configuration, if a WL-WL short-circuit is found in the memory block.

These and other embodiments will be more fully understood from the following detailed description of the embodiments thereof, taken together with the drawings in which:

DETAILED DESCRIPTION OF EMBODIMENTS

Overview

Figure 1:
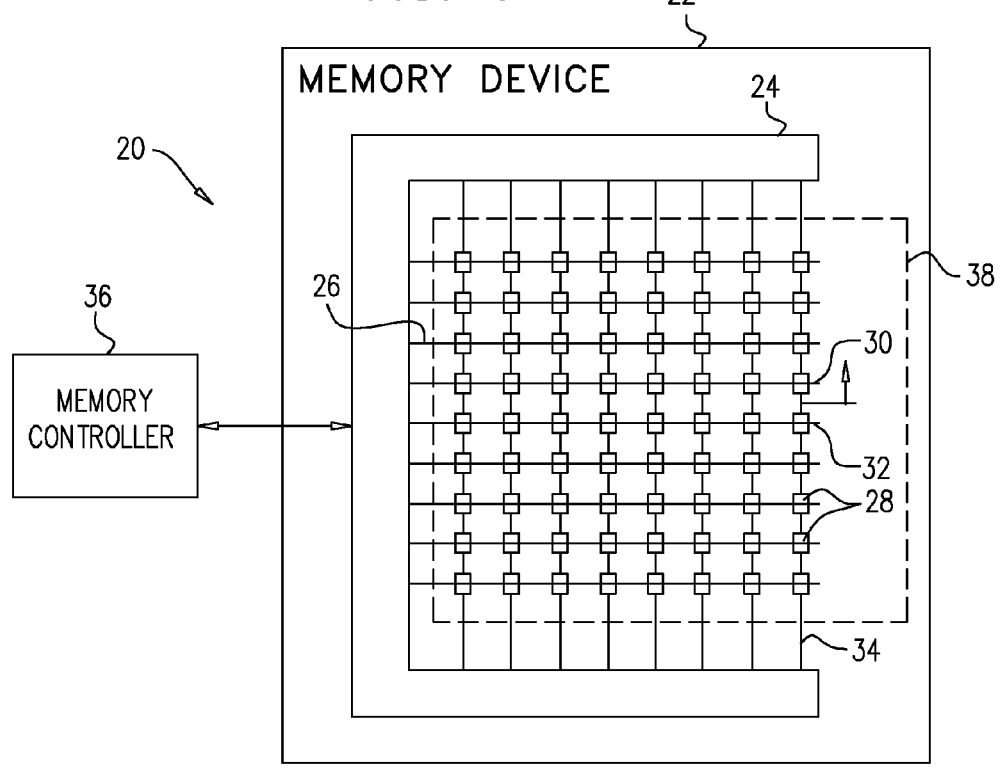
FIG. 1 is a block diagram that schematically illustrates a memory system, in accordance with an embodiment that is described herein.

Embodiments that are described herein provide improved methods and systems for data storage in memory blocks having word-line-to-word-line (WL-WL) short-circuits. In some embodiments, a memory system comprises a memory (e.g., Flash device) and circuitry (e.g., a host, memory controller and/or read/write circuitry in the Flash device) that stores data in the memory. The memory comprises one or more memory blocks. Each memory block comprises multiple memory cells that are arranged in rows associated with Word Lines (WLs) and columns associated with Bit Lines (BLs).

In practice, a short-circuit may occur between a pair of WLs. In the context of the present disclosure and in the claims, the term "WL-WL short-circuit" refers to any event in which the WL-WL resistance falls below some predefined reference resistance, not necessarily an absolute short of zero Ohms. In many cases a WL-WL short-circuit is a developing condition, beginning with a slight decrease in resistance and gradually developing to a full-blown short circuit. In other cases a full-blown short may occur immediately, typically during production. All such events, even in their early stages, are regarded herein as WL-WL short-circuit events.

In many memory device architectures, a WL-WL short-circuit affects the programming and readout of other WLs in the block, as well. Therefore, unless accounted for, a WL-WL short-circuit may render the entire memory block unusable, including loss of the data already stored in the block. The disclosed techniques enable the system to keep using a memory block even in the presence of a WL-WL short-circuit. Some disclosed techniques enable the system to recover the data stored in other WLs in the block. Other disclosed techniques enable the system to program data in other WLs in the block.

In the disclosed embodiments, the circuitry defines a normal voltage configuration that is applied to the WLs of a memory block under normal conditions, and an abnormal voltage configuration that is applied to the WLs of the block in the event of a WL-WL short-circuit. The abnormal voltage configuration aims to reduce the effect of the WL-WL short-circuit on the other WLs of the memory block.

In an example embodiment, the circuitry applies an identical pass voltage ($V_{PASS}$) to the shorted WLs. As a result, little or no current flows through the short. Consider, for example, a scenario in which a WL-WL short occurs between the $n^{th}$ and $n+1^{th}$ WLs (denoted WL(n) and WL(n+1)), and data is to be read from the $n-1^{th}$ WL (denoted WL(n-1)). Under normal conditions, WL(n) would typically be set to a higher $V_{PASS}$ than WL(n+1). In a disclosed embodiment, the circuitry sets both WL(n) and WL(n+1) to the same $V_{PASS}$ in order to minimize current leakage through the short. With these voltages, the circuitry is typically able to read the data from WL(n-1) successfully. Additionally or alternatively, the circuitry may set the $V_{PASS}$ of one or both of the shorted WLs to a higher value than the normal pass voltage.

In some scenarios, a WL-WL short-circuit is characterized by increased erase penetration—Erased memory cells whose threshold voltages are supposed to be negative but have drifted to become positive. In the presence of WL-WL short, erase penetration is often more severe, i.e., more erased memory cells drift more deeply into the positive threshold voltage range.

In another example embodiment, the abnormal voltage configuration aims to overcome the higher erase penetration by setting a higher programming-verification (PV) threshold than the PV threshold used in the normal voltage configuration. In an embodiment, the circuitry adaptively estimates an optimal position for the PV threshold that distinguishes between the erased level and the next-higher programming level. Subsequent WLs in the memory block are programmed using the adaptively-set PV threshold.

The methods and systems described herein reduce the impact of WL-WL short-circuit on the remaining WLs of the memory block. As a result, the memory block in question need not be taken out of service, the data stored in the block is not lost, and new data may be stored in available WLs.

System Description

FIG. 1 is a block diagram that schematically illustrates a memory system 20, in accordance with an embodiment that is described herein. System 20 may comprise, for example, a Solid-State Disk (SSD), a removable memory module, a Secure Digital (SD) card, Multi-Media Card (MMC) or embedded MMC (eMMC), or any other system or device in which data is stored and retrieved.

In the present example, system 20 comprises a memory device 22 and a memory controller 36. Controller 36 stores data in memory 22 and retrieves data from memory 22. Memory device 22 comprises multiple memory cells 28. In the example of FIG. 1 memory cells 28 comprise NAND Flash cells, although any other suitable non-volatile memory type, such as NOR and Charge Trap Flash (CTF) Flash cells, phase change RAM (PRAM, also referred to as Phase Change Memory—PCM), Nitride Read Only Memory (NROM), Ferroelectric RAM (FRAM) and/or magnetic RAM (MRAM), can also be used. The disclosed techniques are applicable in various two-dimensional and three-dimensional memory device configurations, and can be used with volatile memory cells, as well.

In the context of the disclosure and in the claims, memory cells 28 may refer to analog memory cells, which are any non-volatile memory (NVM) cells that hold continuous, analog values of a physical parameter, such as an electrical voltage or charge. Any suitable type of memory cells, such as the types listed above, can be used. In the present example, memory cells 28 comprise NAND Flash cells. The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in memory cells 28 by programming the cells to assume respective memory states, which are also referred to as programming levels. The programming levels are selected from a finite set of possible levels, and each level corresponds to a certain nominal storage value. For example, a 2 bit/cell multi-level cell (MLC) can be programmed to assume one of four possible programming levels by writing one of four possible nominal storage values into the cell. Alternatively, a 3 bit/cell triple-level cell (TLC) can be programmed to assume one of eight possible programming levels by writing one of eight possible nominal storage values into the cell.

Memory cells 28 in device 22 are arranged in memory blocks (also referred to as memory blocks) whose memory cells that are erased together. The present example shows a single memory block 38, for the sake of clarity, but real-life devices typically comprise a large number of blocks. Data typically cannot be reprogrammed in-place, and memory blocks are therefore erased before being programmed with new data. Each memory block typically holds multiple memory pages.

In a given memory block, memory cells 28 are arranged in rows associated with respective word lines 26, and columns associated with respective bit lines 34. Each memory cell is connected to a respective word line (WL) 26 and each bit line 34 is connected to a string of the memory cells. The memory cells of each WL can be programmed with one or more memory pages.

A Read/Write (R/W) unit 24 controls the bit lines and word lines so as to program, read and erase memory cells. R/W unit 24 is connected to memory controller 36, for receiving data for storage in the memory and for sending data retrieved from memory.

The configuration of memory system 20 shown in FIG. 1 is an example configuration, which is chosen purely for the sake of conceptual clarity. In alternative embodiments, any other suitable configuration can be used for implementing the memory system. Certain elements of memory system 20 can be implemented using hardware, such as using one or more Application-Specific Integrated Circuits (ASICs) or Field-Programmable Gate Arrays (FPGAs) or other device types. Additionally or alternatively, certain elements of memory system 20 can be implemented using software, or using a combination of hardware and software elements.

Memory controller 36 may comprise one or more processors or cores that are capable of running software to carry out the functions described herein. The software may be downloaded to the processors or cores in an electronic form, over a network, for example, or it may, alternatively or additionally, be provided and/or stored on non-transitory tangible media, such as magnetic, optical, or electronic memory. In some embodiments, the functionality of the memory controller is carried out by a host. In alternative embodiments, the host and memory controller are implemented separately, e.g., in different Integrated Circuits (ICs).

Data Readout in the Presence of WL-WL Short, by Applying Identical High $V_{PASS}$ to Shorted WLs In some cases, a WL-WL short-circuit may be formed between WLs 26 of memory block 38, typically between a pair of neighboring WLs. Since the memory cells of different WLs are interconnected by BLs 34, a WL-WL short-circuit affects the programming and readout of the other WLs in block 38.

In some embodiments, memory controller 36 and/or R/W unit 24 define an abnormal voltage configuration, which is applied to the WLs of the block in case of WL-WL short-circuit in order to reduce the impact of the short. The disclosed techniques can be used with WL-WL shorts that are formed during manufacturing or during operation.

The techniques described herein can be carried out by memory controller 36, by R/W unit 24, or both. Thus, in the context of the present patent application and in the claims, the memory controller and R/W unit are referred to collectively as circuitry that carried out the methods described herein.

The description that follows refers mainly to an implementation in which memory controller 36 identifies the short, and R/W unit 24 sets the WL voltages to the normal or abnormal voltage configuration, as appropriate. This choice, however, is made purely by way of example. Any of the disclosed techniques, however, can be carried out using any suitable division of labor between the R/W unit and the memory controller, or using only one of these elements.

Typically, the R/W unit applies the normal voltage configuration to the WLs of block 38 under normal conditions. When WL-WL short is found by memory controller 36, or at least suspected, the memory controller instructs the R/W unit to switch to the abnormal voltage configuration.

Figure 2:
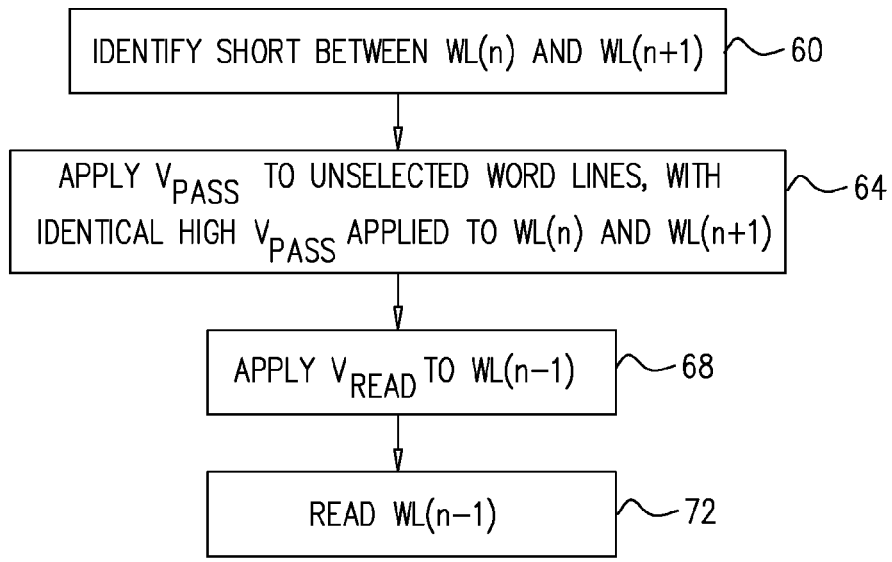
FIG. 2 is a flow chart that schematically illustrates a method for reading data from a word line in a memory block containing a WL-WL short, in accordance with an embodiment that is described herein.

FIG. 2 is a flow chart that schematically illustrates a method for reading data from a word line in a memory block containing a WL-WL short, in accordance with an embodiment that is described herein. In the example of FIG. 2, memory controller 36 reads data from the n−1$^{th}$ WL (denoted WL(n−1)), in the presence of a WL-WL short between the n$^{th}$ and n+1$^{th}$ WLs (denoted WL(n) and WL(n+1)).

Under normal conditions, i.e., with no WL-WL short, memory controller 36 biases WL(n) with a higher pass voltage ($V_{PASS}$) than WL(n+1) during readout of WL(n−1), because WL(n) is closer to the WL being read. When a WL-WL short is detected, on the other hand, the memory controller applies the same $V_{PASS}$ to WL(n) and WL(n+1). Applying the same pass voltage to WL(n) and WL(n+1) causes little or no current to flow through the short. As a result, the memory controller is able to read the data from WL(n−1) successfully.

The method of FIG. 2 begins with memory controller identifying a suspected WL-WL short between the n$^{th}$ and n+1$^{th}$ WLs 26, at a short detection step 60. The WL-WL short in question may have been formed during production of the memory, or later during operation in the host system. Memory controller 36 may use any suitable method for identifying the WL-WL short. Several possible methods are described, for example, in U.S. patent application Ser. No. 14/572,818, entitled "Identifying word-line-to-substrate and word-line-to-word line short-circuit events in a memory block," which is assigned to the assignee of the present patent application and whose disclosure is incorporated herein by reference.

At an abnormal voltage application step 64, R/W unit 24 applies pass voltages to the unselected WLs in the block—To all WLs other than WL(n−1) that is selected for readout. In particular, the R/W unit applies the same pass voltage values to WL(n) and WL(n+1). At a read voltage application step 68, R/W unit 24 applies a read voltage ($V_{READ}$) to WL(n−1). The R/W unit reads WL(n−1) using the voltages set at steps 64 and 68.

In some embodiments, the memory controller may set the abnormal $V_{PASS}$ applied to WL(n) and WL(n+1) to be higher than (one or both of) the corresponding normal $V_{PASS}$ values. Higher $V_{PASS}$ increases the likelihood that the memory cells along the shorted WLs will conduct, and therefore will not distort the readout of WL(n−1).

The description above referred to readout of WL(n−1), for the sake of clarity. In alternative embodiments, the disclosed technique can be used for reading any other WL in the memory block in the presence of WL-WL short between WL(n) and WL(n+1).

Data Programming in the Presence of WL-WL Short, Using Increased Programming-Verification Thresholds Typically, when block 38 is erased, memory cells 28 are set to negative threshold voltages. During subsequent programming, some of the memory cells are written with positive threshold voltages. In practice, the threshold voltages of some of the erased memory cells may drift and become positive, for various reasons. This effect is referred to as "erase penetration." It can be shown that a WL-WL short increases the severity of erase penetration in other WLs in the memory block. In other words, a WL-WL short causes more erased memory cells to drift more deeply into the positive threshold voltage range.

Typically, R/W unit 24 programs data into the WLs of block 38 using an iterative Programming-Verification (PV) process. In this process, the R/W unit compares the threshold voltages of the memory cells to certain PV thresholds, and stops programming the memory cells whose threshold voltages have exceeded the PV thresholds. In the absence of erase penetration, the PV threshold that distinguishes between the erased level and the other levels can be set to zero (0V). When significant erase penetration is present, this PV threshold should typically be set higher in order to distinguish the erased level reliably.

In some embodiments, in the abnormal voltage configuration, memory controller 36 sets the PV threshold that distinguishes the erased level to be higher than the corresponding PV threshold used in the normal voltage configuration. The memory controller uses this PV threshold for programming the subsequent WLs in the block.

Figure 3:
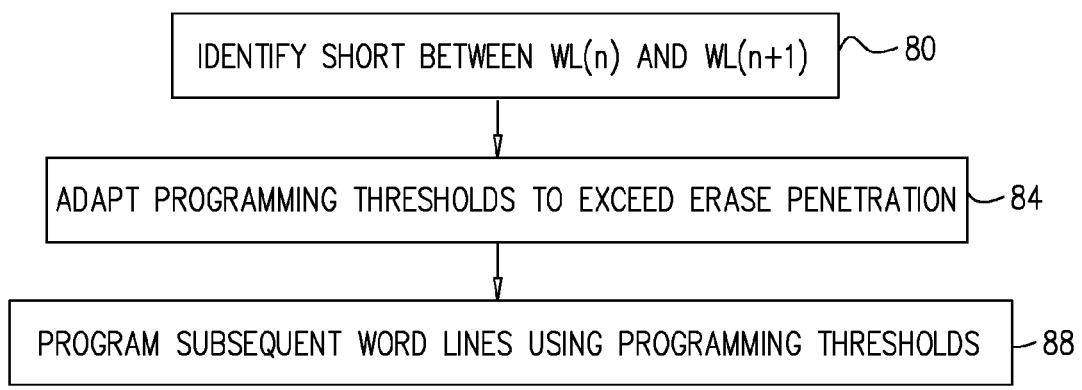
FIG. 3 is a flow chart that schematically illustrates a method for programming data into a memory block containing a WL-WL short, in accordance with an embodiment that is described herein.

FIG. 3 is a flow chart that schematically illustrates a method for programming data into a memory block containing a WL-WL short, in accordance with an embodiment that is described herein. The method begins with memory controller 36 identifying a suspected WL-WL short between the $n^{th}$ and $n+1^{th}$ WLs 26, at a WL-WL short detection step 80.

At a threshold adaptation step 84, memory controller estimates the optimal position for the PV threshold that distinguishes between the erased level and the other programming levels. The estimated optimal position considers the stronger erase penetration caused by the WL-WL short. At a programming step 88, R/W unit 26 programs the subsequent WLs in block 38 using the estimated PV threshold.

The method of FIG. 3 enables memory controller 36 to program the subsequent WLs in block 38, even though a WL-WL short was detected. In some embodiments, the memory controller reverts to this method even though no programming failure (e.g., Programming Status Failure— PSF) was received for that block. In this manner, the memory controller is able to mitigate WL-WL shorts in their early stages of development.

The methods of FIGS. 2 and 3 above are depicted purely by way of example. In alternative embodiments, system 20 may use any other suitable normal and abnormal voltage configurations for mitigating WL-WL shorts.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
defining a first voltage configuration for application to word lines (WLs) and Bit lines (BLs) of a memory block, and a second voltage configuration, different from the first voltage configuration, for application to the WLs and the BLs of the memory block when a word-line-to-word-line (WL-WL) short-circuit is found between at least two of the WLs in the memory block, wherein the second voltage configuration comprises a higher programming-verification threshold than the programming-verification threshold used in the first voltage configuration;
if no WL-WL short-circuit is found in the memory block, performing a data storage operation, which comprises programming a selected WL in the memory block, by applying the first voltage configuration; and
if a WL-WL short-circuit is found in the memory block, performing the data storage operation in the memory block by applying the second voltage configuration.

2. The method according to claim 1, wherein applying the second voltage configuration comprises applying an identical pass voltage to a pair of the WLs between which the WL-WL short-circuit occurs.

3. The method according to claim 2, wherein performing the data storage operation comprises reading data from a WL that neighbors the pair of the WLs, while the identical pass voltage is applied to the pair of the WLs.

4. The method according to claim 1, wherein applying the second voltage configuration comprises applying to a WL in which the WL-WL short-circuit occurs a higher pass voltage than the pass voltage that is applied to the WL in the first voltage configuration.

5. The method according to claim 1, wherein defining the second voltage configuration comprises estimating an erase penetration in the selected WL, and setting the programming-verification threshold based on the estimated erase penetration.

6. The method according to claim 1, and comprising switching from the first voltage configuration to the second voltage configuration even though no programming failure was reported for the memory block.

7. The method according to claim 1, and comprising switching from the first voltage configuration to the second voltage configuration in response to detecting the WL-WL short-circuit during operation of the memory block in a host system.

8. The method according to claim 1, and comprising switching from the first voltage configuration to the second voltage configuration in response to a detection of the WL-WL short-circuit during production testing of the memory block.

9. An apparatus, comprising:
a memory comprising at least a memory block; and
circuitry configured to perform a data storage operation that comprises programming of a selected WL in the memory block, by applying to word lines (WLs) and Bit Lines (BLs) of the memory block a first voltage configuration if no word-line-to-word-line (WL-WL) short-circuit is found between at least two of the WLs in the memory block, and by applying to the WLs and the BLs of the memory block a second voltage configuration, different from the first voltage configuration, if a WL-WL short-circuit is found in the memory block, wherein the second voltage configuration comprises a higher programming-verification threshold than the programming-verification threshold used in the first voltage configuration.

10. The apparatus according to claim 9, wherein, in the second voltage configuration, the circuitry is configured to apply an identical pass voltage to a pair of the WLs between which the WL-WL short-circuit occurs.

11. The apparatus according to claim 10, wherein the data storage operation comprises readout of data from a WL that neighbors the pair of the WLs, while the identical pass voltage is applied to the pair of the WLs.

12. The apparatus according to claim 9, wherein, in the second voltage configuration, the circuitry is configured to apply to a WL in which the WL-WL short-circuit occurs a higher pass voltage than the pass voltage that is applied to the WL in the first voltage configuration.

13. The apparatus according to claim 9, wherein the circuitry is configured to estimate an erase penetration in the selected WL, and to set the programming-verification threshold in the second voltage configuration based on the estimated erase penetration.

14. The apparatus according to claim 9, wherein the circuitry is configured to switch from the first voltage configuration to the second voltage configuration even though no programming failure was reported for the memory block.

15. The apparatus according to claim 9, wherein the circuitry is configured to switch from the first voltage configuration to the second voltage configuration in response to detecting the WL-WL short-circuit during operation of the memory block in a host system.

16. The apparatus according to claim 9, wherein the circuitry is configured to switch from the first voltage configuration to the second voltage configuration in response to a detection of the WL-WL short-circuit during production testing of the memory block.

* * * * *